(12) United States Patent
Jalali Far et al.

(10) Patent No.: US 10,498,564 B2
(45) Date of Patent: Dec. 3, 2019

(54) RECEIVER FOR HANDLING HIGH SPEED TRANSMISSIONS

(71) Applicant: Invecas, Inc., Santa Clara, CA (US)

(72) Inventors: Majid Jalali Far, San Jose, CA (US); Venkata N. S. N. Rao, Fremont, CA (US)

(73) Assignee: Invecas, Inc., Santa Clara, CA (US)

( * ) Notice: Subject to any disclaimer, the term of this patent is extended or adjusted under 35 U.S.C. 154(b) by 12 days.

(21) Appl. No.: 15/895,915

(22) Filed: Feb. 13, 2018

(65) Prior Publication Data

US 2019/0253284 A1    Aug. 15, 2019

(51) Int. Cl.
*H04L 25/03*    (2006.01)
*H03H 7/38*    (2006.01)

(52) U.S. Cl.
CPC ......... *H04L 25/03878* (2013.01); *H03H 7/38* (2013.01)

(58) Field of Classification Search
CPC ............................. H04L 25/03878; H03H 7/38
See application file for complete search history.

(56) References Cited

U.S. PATENT DOCUMENTS

| | | | |
|---|---|---|---|
| 8,395,234 B2 * | 3/2013 | Okushima | H01L 23/5227 257/531 |
| 8,798,204 B2 | 8/2014 | Chen et al. | |
| 8,947,840 B1 * | 2/2015 | Milirud | H02H 9/046 361/56 |
| 9,934,176 B2 * | 4/2018 | Wang | G06F 13/287 |
| 2013/0036218 A1 * | 2/2013 | Campagnoni | H04L 43/14 709/224 |
| 2019/0074129 A1 * | 3/2019 | Fan | H01F 27/2804 |

OTHER PUBLICATIONS

Lin et al., Robust ESD Protection Design for 40-Gb/s Transceiver in 65-nm CMOS Process, IEEE Transactions on Electronic Devices, vol. 60, No. 11, Nov. 2013, p. 3625-3631, USA.
Kim et al., Design of a Reliable Broadband I/O Employing T-Coil, p. 198-204, USA.
Yasuo Hidaka, Comment #18 T-Coil Model for COM, IEEE P802.3bs 400GbE Task Force, 2016 IEEE 802.3 interim meeting, May 25-27, p. 1-30, USA.
Cao et al., IEEE Transactions on Circuits and Systems—I: Regular Papers, vol. 57, No. 9, Sep. 2010, p. 2301-2311, USA.

* cited by examiner

*Primary Examiner* — Siu M Lee
(74) *Attorney, Agent, or Firm* — Venture Pacific Law, PC

(57) ABSTRACT

A high-speed serial link receiver system, comprises: an input terminal for receiving a signal; a pi-coil including a first inductor, a second inductor, and a third inductor; a first electrostatic discharge device ("ESD"); a second ESD; an on-die-termination ("ODT"); and a receiver. The first inductor, the second inductor, and the third inductor are serially connected. The input terminal is coupled to the first inductor. A serial connection between the first inductor and the second inductor is coupled to the first ESD device. A serial connection between the second inductor and the third inductor is coupled to the ODT. The second ESD device and the receiver are coupled to the third inductor.

20 Claims, 13 Drawing Sheets

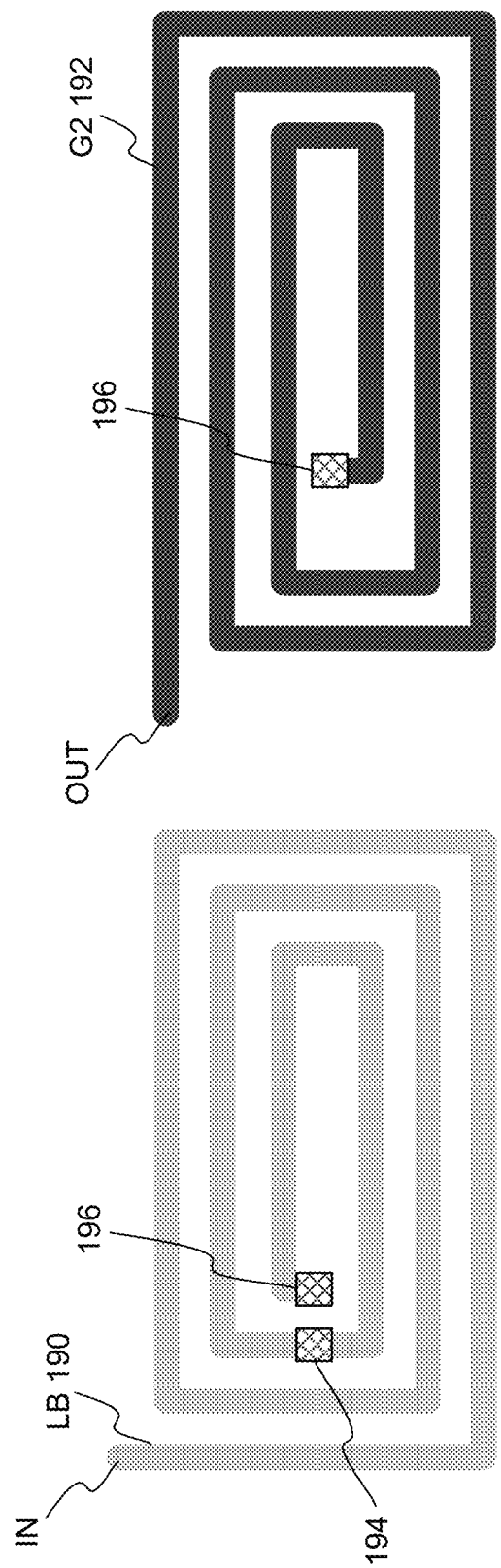

RECEIVER FOR HANDLING HIGH SPEED TRANSMISSIONS

FIELD OF INVENTION

The disclosure generally relates to a high-speed receiver, and more particularly to a receiver having a pi-coil circuit.

BACKGROUND

Chip-to-chip communications are frequently used in telecommunication devices. The speed of the interfaces for such telecommunication devices can exceed 25 Gbps to transmit or receive data. Also, such interfaces are used in a wide range of applications such as peripheral component interconnect ("PCI") express serial links and double data rate ("DDR") memory input/output ("I/O") links. By increasing the data rate of transceivers, the signal bandwidth is impacted by the capacitive loads at the front end of the receiver.

To mitigate the signal loss, equalizers are used in transmitter and receiver side of a transceiver. By increasing the data rate to 25 Gbps or more, the use of coils is inevitable. One of the main capacitive loads is due to electrostatic discharge ("ESD") protection devices. Usually, two types of ESDs are present in every transceiver application, e.g., one for a human body model ("HBM"), which can reach about 2000V, and another for charged device model ("CDM"), which can reach about 500V. The capacitance for these ESDs can be about 400 fF.

Additionally, there are other capacitance sources in a receiver such as metal lines, active devices, and on-die termination ("ODT") resistance. In particular, the ODT resistance has a considerable large capacitance, usually more than 100 fF. Since there is no way to physically reduce or altogether remove those capacitive loads, one method is to electrically hide them and/or contribute those capacitive loads.

FIG. 1 illustrates a prior art transceiver system using t-coils for contributing capacitive loads. In the prior art transceiver system, the transceiver system can be implemented for a differential pair of signals DIP and DIN such that for each one of the differential pair of signals there is a transmitter side, a channel, and a receiver side. The transceiver system comprises transmitters 18a and 18b, resistors 20a-20b, t-coils 22a-22b, ESDs 24a-24b, transmitter pads 26a-26b, printed circuit board ("PCB") channels 28a-28b, receiver pads 30a-30b, t-coils 32a-32b, ESDs 34a-34b that can be implemented by capacitors having a capacitance $C_{ESD}$, on-die termination ("ODT") 38a-38b each having a capacitance Cr and a resistance $R_{term}$, and receivers 40a-40b. Each of the t-coils 22a-22b and 32a-32b comprise two serially connected inductors.

The transmitter 18a drives the signal DIP through the coupled resistor 20a, t-coil 22a, and the ESD 24a to the transmitter pad 26a. The transmitted signal can then be received at the receiver pad 30a via the channel 28a. From there, the received signal travels through the coupled t-coil 32a, the ESD 34a, and the ODT 38a to the receiver 40a for output as a received signal RXP.

Likewise for the signal DIN, the transmitter 18b drives the signal DIN through the coupled resistor 20b, t-coil 22b and the ESD 24b to the transmitter pad 26b. The transmitted signal can then be received at the receiver pad 30b via the channel 28b. From there, the received signal travels through the coupled t-coil 32b, the ESD 34b, and the ODT 38b to the receiver 40b for output as a received signal RXN.

The t-coil network used in both transmitter side and the receiver side can improve return loss and insertion loss. For each side of the transceiver, the t-coil network can provide for an impedance matching circuit. In using a conventional t-coil, the main capacitive loads are coupled to the t-coil between the serially connected inductors of the t-coil.

For instance, the ESD 24a has one end coupled to the serial connection between the inductors La and Lb of the t-coil 22a. The ESD 24b has one end coupled to the serial connection between the inductors La and Lb of the t-coil 22b. Likewise on the receiver side, the ESD 34a has one end coupled to the serial connection between the inductors $L_1$ and $L_2$ of the t-coil 32a. The ESD 34b has one end coupled to the serial connection between the inductors $L_1$ and $L_2$ of the t-coil 32b.

FIG. 2 illustrates an equivalent circuit diagram for a t-coil used in the receiver side of the prior art transceiver system. The receiver side of the prior art transceiver system illustrated in FIG. 1 can be modeled by the circuit diagram illustrated in FIG. 2. Referring to FIG. 2, a classic t-coil network consists of two coupled inductors $L_{1m}$ and $L_{2m}$ that have a mutual inductance M with a coupling factor K. The mutual inductance M can be modeled by having a third inductor $L_M$ coupled to the t-coil. The simplified t-coil after applying an effect of mutual inductance is:

$$L_{1m} = L_1 - L_m \qquad \text{EQ[1]}$$

$$L_{2m} = L_2 - L_m \qquad \text{EQ[2]}$$

$$L_m = -K\sqrt{L_1 L_2} \qquad \text{EQ[3]}$$

A t-coil network can be used in a front end of a receiver with various ODT placements. The ODT can be a variable resistor having resistance $Rt_{erm}$ (e.g., 50 ohm) to set channel impedance and can also have a high capacitance $C_R$.

The ODT is placed at one end of t-coil network to hide the effectiveness of the ODT capacitance $C_R$ from an input terminal IN of the t-coil. Thereby input return loss is improved because the $C_{ESD}$ capacitance is the primary impedance at the input terminal of the t-coil network. However, while this technique improves input return loss, it increases input capacitive load on the input stage of the receiver.

FIG. 3 illustrates another prior art transceiver system using t-coils for contributing capacitive loads. There can be different methods to contribute the capacitive loads of the ESD and the ODT. In such alternative configuration, to mitigate input capacitive loads on the input stage of the receiver, the ODT 38a is disposed in parallel with the ESD 34a with one end of the parallel connection coupled to a middle serial connection of the t-coil network 32a, and the ODT 38b is disposed in parallel with the ESD 34b with one end of the parallel connection coupled to a middle serial connection of the t-coil network 32b. The drawback in such alternative configuration is an increase of capacitance at the input terminal of the t-coil networks 32a and 32b, which degrades the return loss.

FIG. 4 illustrates an equivalent circuit diagram for another configuration of a t-coil used on the receiver side of the prior art transceiver system illustrated in FIG. 3. In this equivalent circuit, a t-coil comprises two inductors, where the two inductors $L_{1M}$ and $L_{2M}$ are serially connected across an input and an output. An effective capacitance across the input and the output can be represented by the capacitor Cp for modeling purposes. The middle point of the t-coil (i.e., the serial connection between the $L_{1M}$ and $L_{2M}$) is further coupled to an end of an inductor $L_M$, where the inductor $L_M$ is used for modeling of the mutual inductance and is not an actual physical component. Another end of the inductor $L_M$ is coupled to the capacitors $C_{ESD}$ and $C_R$ and resistors $R_{term}$. The drawback here is that the total capacitance (i.e., $C_{ESD}+C_R$) is increased, which results in degrading the return loss.

FIG. 5 illustrates a generic t-coil of the prior art coupled to a receiver side. In essence, the t-coil can be described by the following equations for finding insertion loss and return loss.

$$M = K\sqrt{L_1 L_2} \quad \text{EQ[4]}$$

$$V_1 = [Z_{11}]I_1 + [Z_{12}]I_2 \quad \text{EQ[5]}$$

$$V_2 = [Z_{21}]I_1 + [Z_{22}]I_2 \quad \text{EQ[6]}$$

$$Z_{11} = \frac{1 + L_1 C s^2}{Cs} \quad \text{EQ[7]}$$

$$Z_{12} = Z_{21} = \frac{1 - MCs^2}{Cs} \quad \text{EQ[8]}$$

$$Z_{22} = \frac{1 + L_2 C s^2}{Cs} \quad \text{EQ[9]}$$

With $s=j\omega$, then:

$$Z_{11} = \frac{1 - L_1 C \omega^2}{jC\omega} \quad \text{EQ[10]}$$

$$Z_{12} = Z_{21} = \frac{1 + MC\omega^2}{jC\omega} \quad \text{EQ[11]}$$

$$Z_{22} = \frac{1 - L_2 C \omega^2}{jC\omega} \quad \text{EQ[12]}$$

The insertion loss S21 can be written as follows:

$$\text{Insertion loss: } 20\log(S_{21}) \quad \text{EQ[13]}$$

$$S_{21} = 2 \times \frac{Z_{21} Z_O}{(Z_{11} + Z_O)(Z_{22} + Z_O) - Z_{12} Z_{21}} \quad \text{EQ[14]}$$

where Zo is direct current ("DC") resistance, which can be about 50 ohm due to the termination resistance $R_{term}$. The Equation [14] shows that factor Z12 (since Z12=Z21) is a main factor to determine insertion loss. In fact, it determines the real part of denominator. For example, the denominator ("Denom") can be as follows:

$$\text{Denom} = (Z_{11} + Z_O)(Z_{22} + Z_O) - Z_{12} Z_{21} = \quad \text{EQ[15]}$$
$$\left(\frac{1 - L_1 C \omega^2}{jC\omega} + Z_O\right)\left(\frac{1 - L_2 C \omega^2}{jC\omega} + Z_O\right) + \left(\frac{1 + MC\omega^2}{C\omega}\right)^2$$

The main factor of S21 is $$\frac{1}{C\omega} + M\omega = \frac{1}{C\omega} + \omega K \sqrt{L_1 L_2} \quad \text{EQ[16]}$$

When capacitance C increases, the denominator of S21 reduces resulting in increased insertion loss. Additionally, to optimize IL of coil, input inductance L1 should be smaller than output inductance (L2>L1).

Alternating current ("AC") gain can be extracted from the insertion loss. If input and output loading is equal, then the AC gain can be written as the following:

$$\text{AC gain: } \frac{V_2}{V_1} = \frac{S_{21}}{2} \quad \text{EQ[17]}$$

In fact, the factor S21 is changing over frequency. In the t-coil structure, by increasing frequency, the insertion loss will be degraded since the denominator of S21 is increased, resulting in reducing S21 and consequently the AC gain.

The return loss S11 can be written as follows:

$$\text{Return loss: } 20\log(S_{11}) \quad \text{EQ[18]}$$

$$S_{11} = \frac{(Z_{11} - Z_O)(Z_{22} + Z_O) - Z_{12} Z_{21}}{(Z_{11} + Z_O)(Z_{22} + Z_O) - Z_{12} Z_{21}} \quad \text{EQ[19]}$$

$$Z_{11} = \frac{1 - L_1 C \omega^2}{jC\omega} \quad \text{EQ[20]}$$

$$Z_{12} = Z_{21} = \frac{1 + MC\omega^2}{jC\omega} \quad \text{EQ[21]}$$

$$Z_{22} = \frac{1 - L_2 C \omega^2}{jC\omega} \quad \text{EQ[22]}$$

When Z21=Z12, $$S_{11} = \frac{(Z_{11} - Z_O)(Z_{22} + Z_O) - (Z_{12})^2}{(Z_{11} + Z_O)(Z_{22} + Z_O) - (Z_{12})^2} \quad \text{EQ[23]}$$

the factor S11 is determined by Z11 as a main parameter.

$$Z_{11} = \frac{1 - L_1 C \omega^2}{jC\omega} = -j\left(\frac{1}{C\omega} - L_1 \omega\right) \quad \text{EQ[24]}$$

From equation, Z11 depends on capacitance and input inductance $L_1$. If it is assumed $L_1=L_2$, Z11 equals Z22, then $$S_{11} = \frac{(Z_{11})^2 - (Z_O)^2 - (Z_{12})^2}{(Z_{11})^2 + 2 Z_{11} Z_O + (Z_O)^2 - (Z_{12})^2} \quad \text{EQ[25]}$$

$$S_{11} = \frac{-\left(\frac{1}{C\omega} - L_1 \omega\right)^2 - (Z_O)^2 + \left(\frac{1}{C\omega} + M\omega\right)^2}{-\left(\frac{1}{C\omega} - L_1 \omega\right)^2 - j2\left(\frac{1}{C\omega} - L_1 \omega\right) Z_O + (Z_O)^2 + \left(\frac{1}{C\omega} + M\omega\right)^2} \quad \text{EQ[26]}$$

From reflection coefficient S11, the increase of capacitance C improves return loss in the low frequency, but by increasing frequency, the increase of capacitance results in degrading return loss, shown in FIG. 10. When capacitance C increases, the denominator of S21 reduces, resulting in an increase of the insertion loss.

Therefore, it is desirable to provide improved new methods, systems, and circuits for mitigating return loss and insertion loss for a receiver of a high-speed transmission.

DESCRIPTION OF THE DRAWINGS

The foregoing and other aspects of the disclosure can be better understood from the following detailed description of the embodiments when taken in conjunction with the accompanying drawings.

FIGS. 11a-11c illustrate a physical layout for a pi-coil of the present disclosure.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as "first", "second", "third", etc. are used to distinguish between elements such terms describe. These terms are not necessarily intended to indicate temporal or prioritization of such elements, unless otherwise explicitly stated.

A pi-coil can aid in contributing and/or hiding capacitive loads. The pi-coil network can hide the ODT capacitance inside inductance coils. The ESD and ODT capacitances can be placed at different mid-points of the pi-coil network to improve insertion loss and input return loss; thereby the capacitances are contributed. Furthermore, the capacitances can be hidden by the three-inductor network of the pi-coil. This can result in having an AC peaking gain for the input of the linear equalizer ("LEQ") block.

Furthermore, the advantages of a pi-coil include one or more of the following: introducing a novel impedance matching structure for a front end of a serial link receiver; hiding capacitive loads from the LEQ block of the receiver; contributing capacitors and hiding them between inductance coils; improving input return loss of the matching circuit by reducing the input referred capacitance results in reducing capacitive impedance; improving insertion loss by increasing AC gain of passive coils; and increasing the AC gain and having a peaking AC gain in a certain frequency range, where the frequency range can be determined by the inductance coils.

Figure 1:
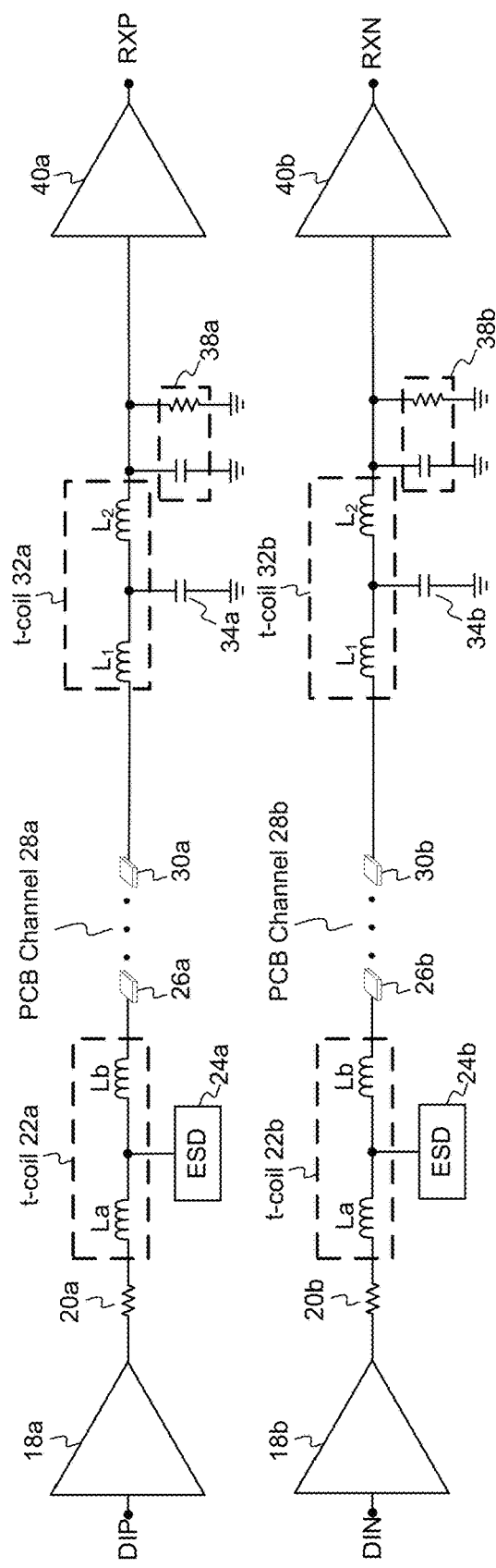
FIG. 1 illustrates a prior art transceiver system using t-coils for contributing capacitive loads.
Figure 2:
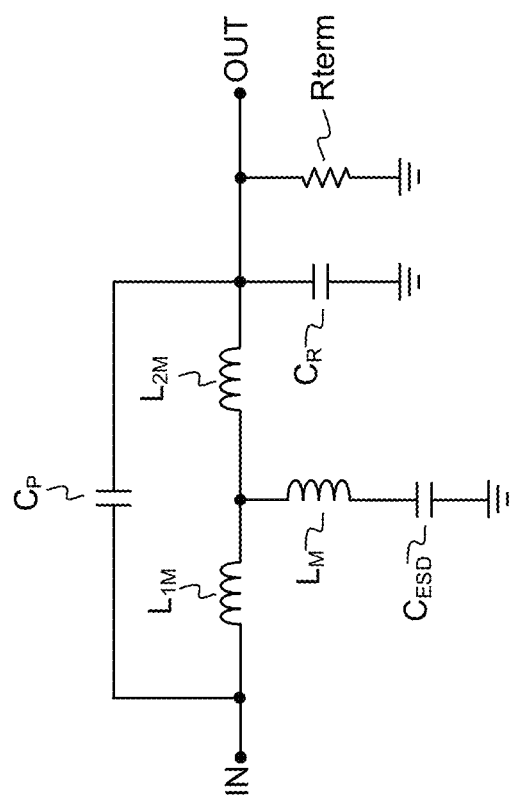
FIG. 2 illustrates an equivalent circuit diagram for a t-coil used in a receiver side of a prior art transceiver system.
Figure 3:
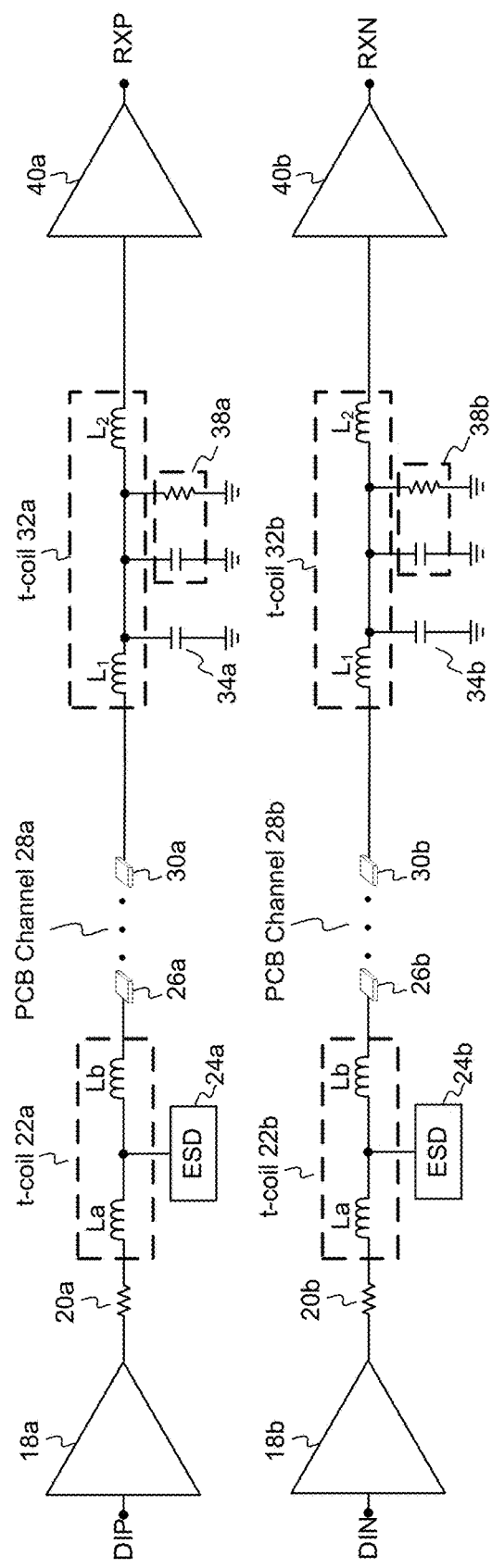
FIG. 3 illustrates another prior art transceiver system using t-coils for contributing capacitive loads.
Figure 4:
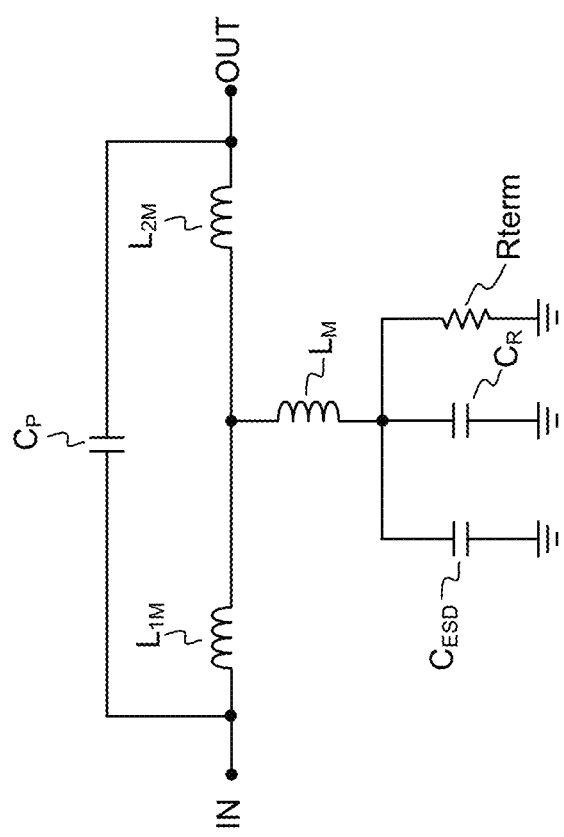
FIG. 4 illustrates an equivalent circuit diagram for another configuration of a t-coil used in a prior art transceiver system.
Figure 5:
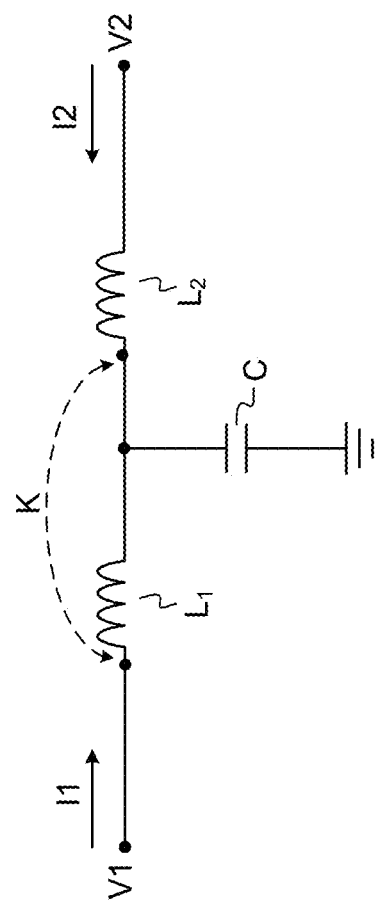
FIG. 5 illustrates a generic t-coil of the prior art coupled to a capacitor at the midpoint of the t-coil.
Figure 6:
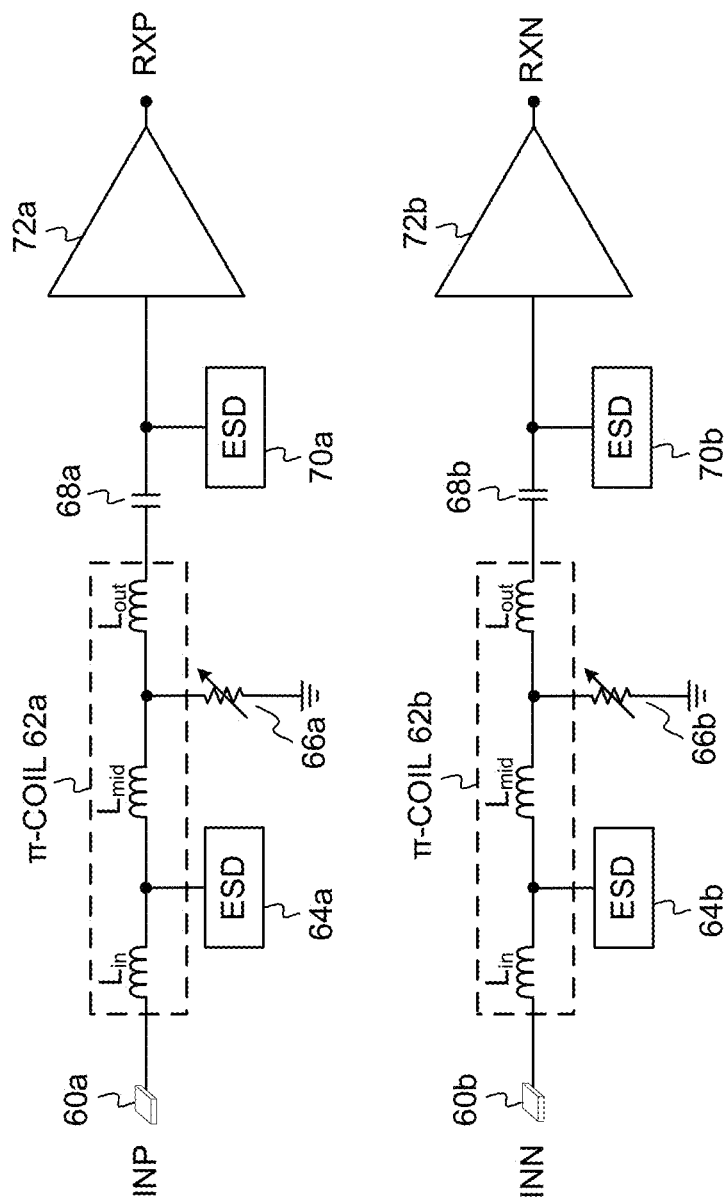
FIG. 6 illustrates a receiver of the present disclosure having a pi-coil.

FIG. 6 illustrates a receiver of the present disclosure having a pi-coil. In an embodiment of a receiver of the present disclosure, the receiver can comprise inputs pads 60a-60b, pi-coils (also referred to as "π-coil") 62a-62b, ESDs 64a-64b and 70a-70b, termination resistors 66a-66b, blocking capacitors 68a-68b, and receivers RXP 72a and RXN 72b. The pi-coils 62a-62b each comprise three serially connected inductors, $L_{in}$, $L_{mid}$, and $L_{out}$. Simulations can be applied to determine the relative values of each of the inductors for impedance matching of the corresponding capacitance to be hidden or contributed. For instance, in one simulation example for 12.5 GHz (or 25 Gb/s data rate), the variables can be found to be $L_{in}$=800 pH, $L_{mid}$=300 pH, $L_{out}$=700 pH, $C_{ESD}$=400 fF, $C_R$=100 fF, and a coupling factor K=0.45.

For processing the INP signal, the pad 60a, the pi-coil 62a, the blocking capacitor 68a, and the receiver 72a are serially connected. The ESD 64a is coupled at the serial connection between the inductor $L_{in}$ and the inductor $L_{mid}$ of the pi-coil 62a. The ESD 64a can be used for HBM protection. The termination resistor 66a is coupled across the serial connection between the inductor $L_{mid}$ and the inductor $L_{out}$ of the pi-coil 62a and ground. The ESD 70a is coupled at the serial connection between the blocking capacitor and the receiver RXP 72a. The ESD 70a can be used for CDM protection. The blocking capacitor 68a is an optional element and can be omitted. In an embodiment in which the blocking capacitor 68a is omitted, the ESD 70a can be coupled at the serial connection between the inductor $L_{out}$ of the pi-coil 62a and the receiver RXP 72a.

For processing the INN signal, the pad 60b, the pi-coil 62b, the DC blocking capacitor 68b, and the receiver 72b are serially connected. The ESD 64b is coupled at the serial connection between the inductor $L_{in}$ and the inductor $L_{mid}$ of the pi-coil 62b. The ESD 64b can be used for HBM protection. The termination resistor 66b is coupled across the serial connection between the inductor $L_{mid}$ and the inductor $L_{out}$ of the pi-coil 62b and ground. The ESD 70b is coupled at the serial connection between the blocking capacitor 68b and the receiver RXN 72b. The ESD 70b can be used for CDM protection. The blocking capacitor 68b is an optional element and can be omitted. In an embodiment in which the blocking capacitor 68b is omitted, the ESD 70b can be coupled at the serial connection between the inductor $L_{out}$ of the pi-coil 62b and the receiver RXN 72b.

It can be appreciated that a pi-coil of the present disclosure can be used on the transmitter side as well for a transceiver system. To aid in the understanding of the present disclosure, a receiver is described herein in conjunction with a pi-coil. However, in no way is the present disclosure meant to be limited to receivers since it is apparent to a person having ordinary skill in the art that a pi-coil can be used in a transmitter as well for hiding and contributing capacitive loads of the transmitter side.

Furthermore, it can be appreciated that the pi-coil can be used for differential signaling and single ended signaling as well. To aid in the understanding of the present disclosure, differential signaling may be used herein in conjunction with a pi-coil. However, in no way is the present examples meant to limit the present disclosure to differential signaling.

Figure 7:
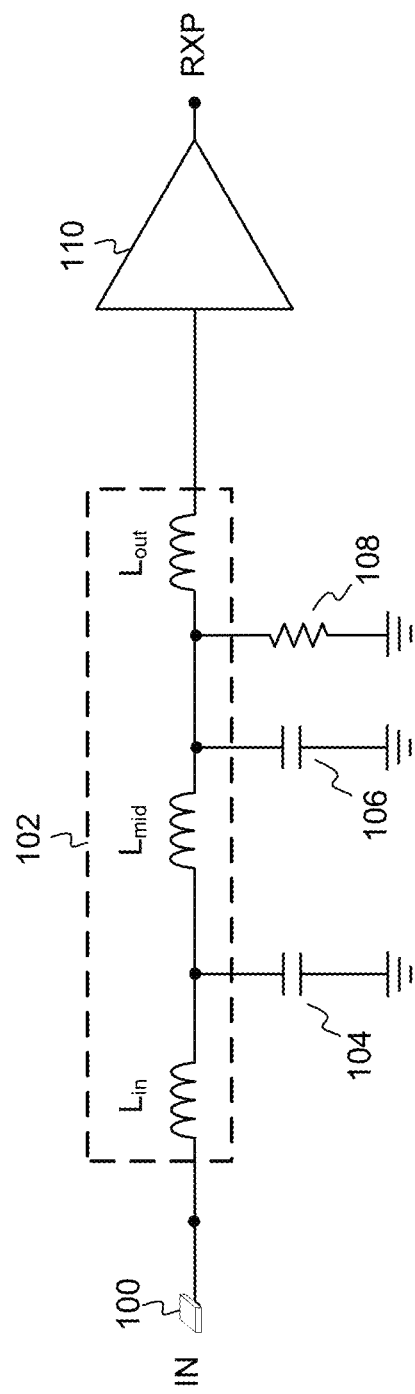
FIG. 7 illustrates another embodiment of a receiver of the present disclosure using a pi-coil circuit.

FIG. 7 illustrates another embodiment of a receiver of the present disclosure using a pi-coil circuit. A pi-coil of the present disclosure can be used for a receiver using single-ended signaling. The receiver can comprise a pad 100, a pi-coil 102, an ESD capacitor 104, a termination capacitor 106, a termination resistor 108, and a receiver 110. The ESD protection circuit can be implemented by an equivalent circuit of the ESD capacitor 104 having capacitance $C_{ESD}$. Furthermore, a termination circuit can be idealized and represented by the termination resistor 108 having resistance $R_{term}$ and the termination capacitor 106 having capacitance $C_R$. The termination resistor 108 and the termination capacitor 108 can be coupled to a serial connection within the pi-coil (as shown) or can be coupled to an end point of the pi-coil (not shown, but apparent from the present disclosure) for contribution and hiding of the capacitive load.

For processing the IN signal, the pad 100, the pi-coil 102, and the receiver 110 are serially connected. The ESD capacitor 104 has one end coupled to a serial connection between the inductors $L_{in}$ and $L_{mid}$ of the pi-coil 102. The ESD capacitor 104 can be used for HBM protection and/or CDM protection. The termination capacitor 106 and the termination resistor 108 can be connected in parallel across the serial connection between the inductors $L_{mid}$ and $L_{out}$ of the pi-coil 102 and ground.

The capacitance and resistance of the termination circuit formed by the capacitor 106 and the resistor 108 can be coupled to the serial connection within the pi-coil 102. In other embodiments, the termination circuit can be coupled to an endpoint of the pi-coil. It can be apparent that the pi-coil has the flexibility to allow for placement of capacitive loads in various configurations such as the one illustrated in FIG. 6 and another one illustrated in FIG. 7.

Figure 8:
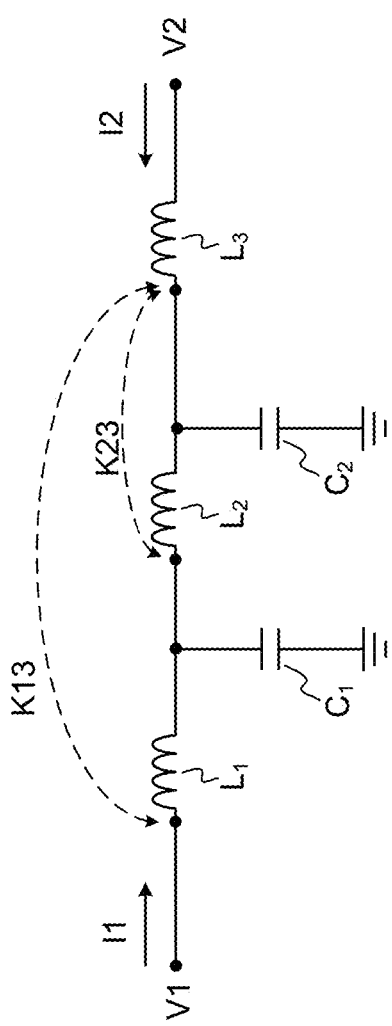
FIG. 8 illustrates a circuit diagram of a pi-coil circuit of the present disclosure coupled to two capacitors used for ESD.

FIG. 8 illustrates a circuit diagram of a pi-coil circuit of the present disclosure connected to ESDs that are modeled by capacitors. The pi-coil comprises three inductors $L_1$, $L_2$, and $L_3$, where the inductors $L_1$, $L_2$, and $L_3$ are serially connected. A capacitor $C_1$ is coupled to a serial connection between the inductors $L_1$ and $L_2$ and a capacitor $C_2$ is coupled to a serial connection between the inductors $L_2$ and $L_3$. The capacitors $C_1$ and $C_2$ can be used to generally refer to any separable capacitive loads, e.g., ESDs, for the purposes of hiding and contributing by the pi-coil of the present disclosure.

The inductors $L_1$ and $L_2$ have a mutual inductance to inductor $L_3$ with a coupling factor of K13 and K23. Additionally, mutual inductance between $L_1$ and $L_2$ can be negligible and thus not shown or modeled. Each inductor can have negligible parasitic capacitances and negligible parasitic capacitances between any coupled inductors, which are not shown in the figure.

The capacitor can represent a cumulative capacitive load for ESD protection. The capacitor $C_2$ can represent the capacitive load from the ODT. Thus, the ODT capacitance load is hidden between the inductors $L_2$ and $L_3$, which causes the input reflections loss (return loss) to improve without having an adverse effect on an equalizer block (i.e., an LEQ block) of the respective receiver.

The idealized pi-coil coupled to such capacitors $C_1$ and $C_2$ can be described by the following equations:

$$M_1 = K_{13}\sqrt{L_1 L_3} \quad \text{EQ[27]}$$

$$M_2 = K_{23}\sqrt{L_2 L_3} \quad \text{EQ[28]}$$

$$V_1 = [Z_{11}]I_1 + [Z_{12}]I_2 \quad \text{EQ[29]}$$

$$V_2 = [Z_{21}]I_1 + [Z_{22}]I_2 \quad \text{EQ[30]}$$

$$Z_{11} = \frac{1 + (L_1 C_1 + L_2 C_2 + L_1 C_2)s^2 + L_1 C_1 L_2 C_2 s^4}{s(C_1 + C_2 + C_1 C_2 L_2 s^2)} \quad \text{EQ[31]}$$

$$Z_{12} = Z_{21} = \frac{1 + (M_2 C_2 - M_1 C_1 - M_1 C_2)s^2 - M_1 C_1 L_2 C_2 s^4}{s(C_1 + C_2 + C_1 C_2 L_2 s^2)} \quad \text{EQ[32]}$$

$$Z_{22} = \frac{1 + (L_1 C_2 + L_3 C_1 + L_3 C_2 - 2M_2 C_1)s^2 + (L_3 C_1 L_2 C_2 - C_1 C_2 M_2^2)s^4}{s(C_1 + C_2 + C_1 C_2 L_2 s^2)} \quad \text{EQ[33]}$$

The insertion loss S21 can be defined as:

$$S_{21} = 2 \times \frac{Z_{21} Z_O}{(Z_{11} + Z_O)(Z_{22} + Z_O) - Z_{12} Z_{21}} \quad \text{EQ[34]}$$

The Equation [34] shows that factor Z12 is a main factor in determining insertion loss. In fact, it can determine the real part of denominator of Equation [34]. For example, the denominator of Equation [34] can be rewritten as the following:

$$Denom = (Z_{11} + Z_O)(Z_{22} + Z_O) - Z_{12} Z_{21} = \\ Z_{11} Z_{22} + Z_{11} Z_O + Z_{22} Z_O + (Z_O)^2 - (Z_{21})^2 \quad \text{EQ[35]}$$

where, $$Z_{11} = \frac{1 - (L_1 C_1 + L_2 C_2 + L_1 C_2)\omega^2 + L_1 C_1 L_2 C_2 \omega^4}{j\omega(C_1 + C_2 - C_1 C_2 L_2 \omega^2)} \quad \text{EQ[36]}$$

$$Z_{22} = \frac{1 - (L_1 C_2 + L_3 C_1 + L_3 C_2 - 2M_2 C_1)\omega^2 + (L_3 C_1 L_2 C_2 - C_1 C_2 M_2^2)\omega^4}{j\omega(C_1 + C_2 - C_1 C_2 L_2 \omega^2)} \quad \text{EQ[37]}$$

$$(Z_{21})^2 = -\left(\frac{1 - (M_2 C_2 - M_1 C_1 - M_1 C_2)\omega^2 - M_1 C_1 L_2 C_2 \omega^4}{\omega(C_1 + C_2 - C_1 C_2 L_2 \omega^2)}\right)^2 \quad \text{EQ[38]}$$

$$S_{21} = 2 \times \frac{Z_{21} Z_O}{(Z_{11} + Z_O)(Z_{22} + Z_O) - (Z_{21})^2} \quad \text{EQ[39]}$$

The main factor of S21 is Z21 since it has an effect on both the denominator and numerator. The reduction of Z21 results in reducing insertion loss. The factor Z21 depends on capacitances of the capacitors C1 and C2 and mutual inductances of the pi-coil. The contributing capacitances can cancel each other to a certain extent, shown in Equation [38], and can even make an AC gain. For instance, in Equation [38], there are two capacitors C1 and C2 that are summed and subtracted in the denominator. Subtracting the capacitances of the capacitors C1 and C2 can reduce the denominator, which further increases the factor Z21. In turn, a larger factor Z21 can reduce insertion loss as shown in Equation [39]. In a limited input frequency range, those summation and subtractions of the capacitances in Equation [38] can cause an AC gain. Moreover, mutual inductances can also aid in improving insertion loss. By increasing the capacitance of $C_2$ and decreasing the capacitance of $C_1$, the insertion loss ("IL") can be further improved.

The AC gain can be extracted from the insertion loss. If input and output loading can be equal, then the AC gain can be as follows:

$$\text{AC gain: } \frac{V_2}{V_1} = \frac{S_{21}}{2} \qquad \text{EQ[40]}$$

In fact, the factor S21 can change over frequency. In a pi-coil structure, by increasing the frequency, the insertion loss can be degraded in some input frequency range. Furthermore, an AC gain can occur when the numerator has a value larger than the denominator. In a limited input frequency range, the denominator can be reduced and provide an AC peaking gain. The AC gain can be larger if (1) the inductor $L_1$ is selected to be close to or equal to the inductance value for $L_3$ and (2) the inductance value of $L_2$ is less than both the individual inductance values of $L_1$ and $L_3$ (e.g., $L_2 < L_1 \approx L_3$). The inductance value $L_1$ may not equal the inductance value $L_3$ due to physical layout limitations for the inductors; such cases can be referred to as the inductance value of $L_1$ and the inductance value of $L_3$ are substantially equal.

The return loss S11 can be written as the following:

$$\text{Return loss: } 20\log(S_{11}) \qquad \text{EQ[41]}$$

$$S_{11} = \frac{(Z_{11} - Z_O)(Z_{22} + Z_O) - Z_{12}Z_{21}}{(Z_{11} + Z_O)(Z_{22} + Z_O) - Z_{12}Z_{21}} \qquad \text{EQ[42]}$$

$$Z_{11} = \frac{1 - (L_1 C_1 + L_2 C_2 + L_1 C_2)\omega^2 + L_1 C_1 L_2 C_2 \omega^4}{j\omega(C_1 + C_2 - C_1 C_2 L_2 \omega^2)} \qquad \text{EQ[43]}$$

$$Z_{22} = \frac{1 - (L_1 C_2 + L_3 C_1 + L_3 C_2 - 2M_2 C_1)\omega^2 + (L_3 C_1 L_2 C_2 - C_1 C_2 M_2^2)\omega^4}{j\omega(C_1 + C_2 - C_1 C_2 L_2 \omega^2)} \qquad \text{EQ[44]}$$

$$(Z_{21})^2 = -\left(\frac{1 - (M_2 C_2 - M_1 C_1 - M_1 C_2)\omega^2 - M_1 C_1 L_2 C_2 \omega^4}{\omega(C_1 + C_2 - C_1 C_2 L_2 \omega^2)}\right)^2 \qquad \text{EQ[45]}$$

When Z21=Z12, the factor S11 can be written as:

$$S_{11} = \frac{(Z_{11} - Z_O)(Z_{22} + Z_O) - (Z_{12})^2}{(Z_{11} + Z_O)(Z_{22} + Z_O) - (Z_{12})^2} \qquad \text{EQ[46]}$$

The Equation [46] for S11 can be determined by the factor Z11 as a main parameter. By reducing the factor Z11, the numerator is reduced resulting in degrading return loss. The factor Z11 depends on capacitances and inductances as written. By reducing the capacitance for $C_1$, the return loss can be improved. Furthermore, by increasing the inductance for $L_1$, the return loss can be also improved.

The main factor of Equation [39] for S21 is the factor Z21 since it has an effect on both the denominator and numerator. The increase of the factor Z21 results in reducing the insertion loss since the denominator of Equation [39] can be increased. However, the factor Z21 depends on capacitances of the capacitors C1 and C2 and mutual inductances of the pi-coil. The contributing capacitances can cancel each other to a certain extent, shown in Equation [38], and can even make an AC gain. For instance, in Equation [38], there are two capacitors C1 and C2 that are summed and subtracted in the denominator. The subtracting of the capacitances of the capacitors C1 and C2 reduces the denominator, which increases the factor Z21. In turn, a larger factor Z21 can reduce insertion loss as shown in Equation [39]. In a limited input frequency range, those summation and subtractions of the capacitances in Equation [38] can cause an AC gain. Moreover, the mutual inductances can also aid in improving insertion loss. By increasing the capacitance of $C_2$ and decreasing the capacitance of $C_1$ in Equation [39], the insertion loss can be further improved.

Figure 10:
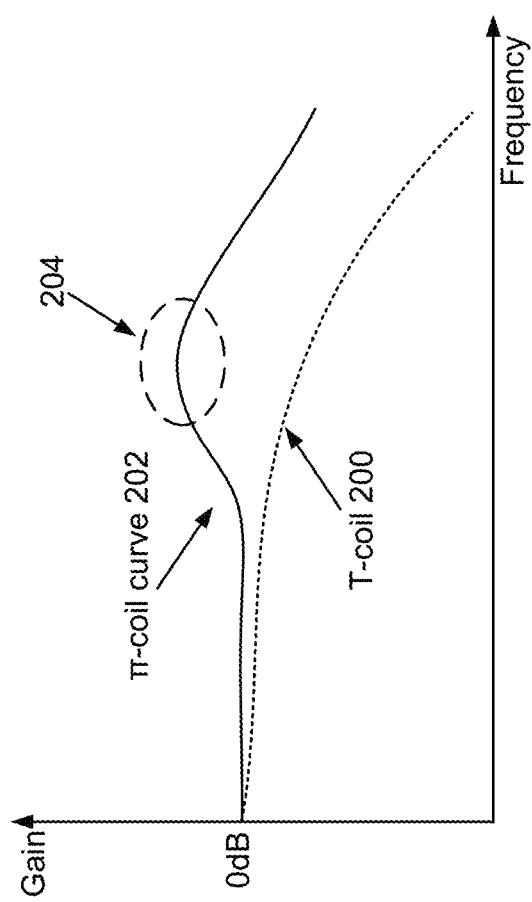
FIG. 10 illustrates a graph of frequency versus gains when comparing a pi-coil circuit of the present disclosure with a t-coil.

The factor S21 can change over frequency. In a pi-coil structure, by increasing an input frequency of the respective receiver, the insertion loss can be degraded. However, in certain input frequency ranges, such increase of the input frequency can reduce insertion loss. FIG. 10 illustrates such behavior.

Referring to FIG. 8, a positive gain can be obtained for a limited frequency range. The AC gain can occur when the numerator of Equation [39] has a value larger than the denominator of Equation [39]. In the limited frequency range, the denominator is reduced and provides an AC peaking gain. The AC gain can be larger if (1) the inductance value of $L_1$ is close to or equal to the inductance value of $L_3$ and (2) the inductance value of $L_2$ is less than the individual inductance values for $L_1$ and $L_3$ (e.g., $L_2 < L_1 \approx L_3$). The inductance value for $L_1$ may not equal the inductance value for $L_3$ due to physical layout limitations for the inductors; such cases can be referred to as the inductance value of $L_1$ and the inductance value of $L_3$ are substantially equal.

From Equation [46] for S11, the factor Z11 depends on capacitances and inductances. Reducing the capacitance of C1 in Equation [46] can improve the return loss. Also, increasing the inductance of $L_1$ in Equation [46] can also improve return loss.

Figure 9A:
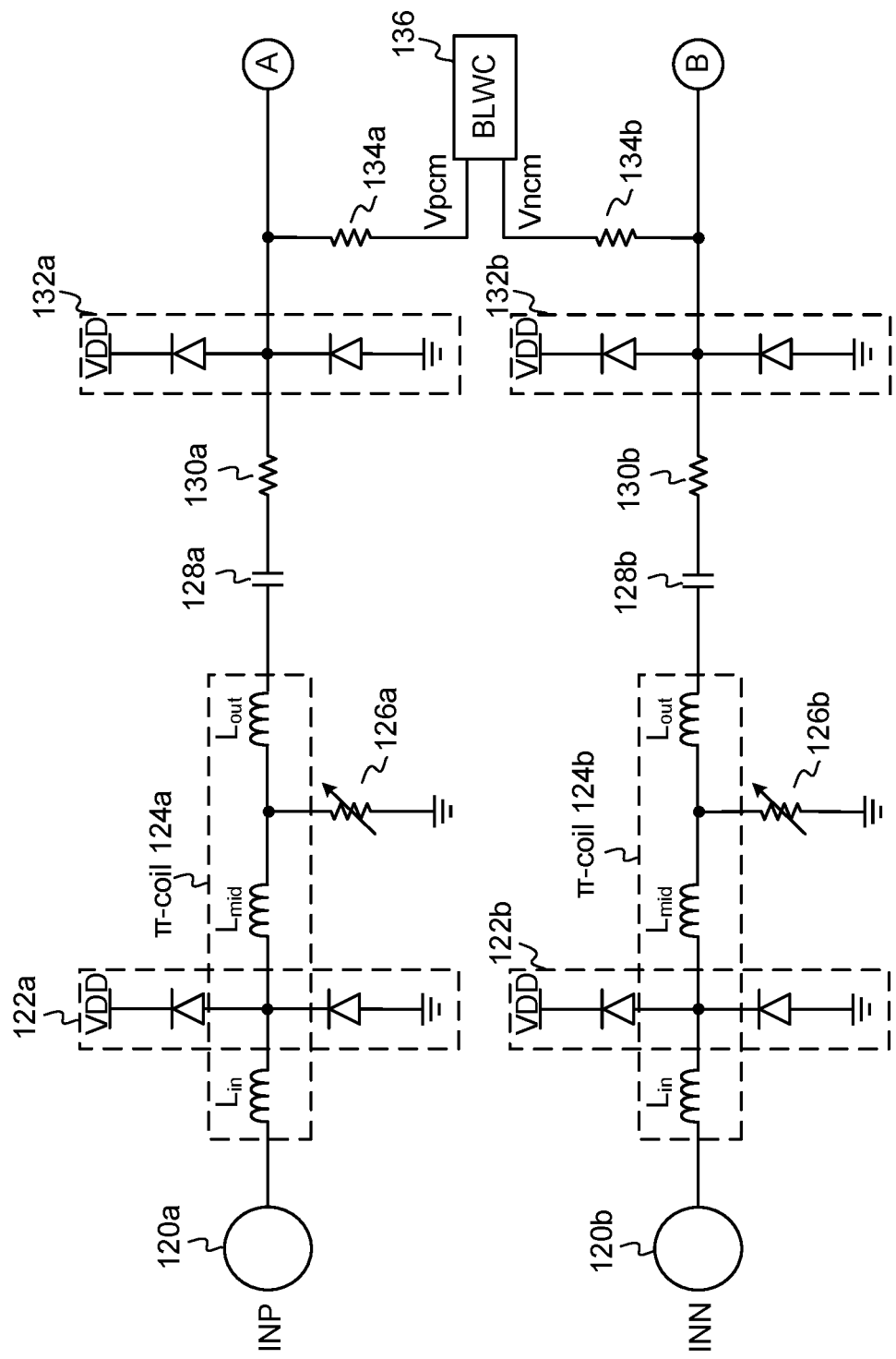
FIGS. 9a-9b illustrate a circuit diagram of a front-end of a receiver of the present disclosure having a pi-coil.
Figure 9B:
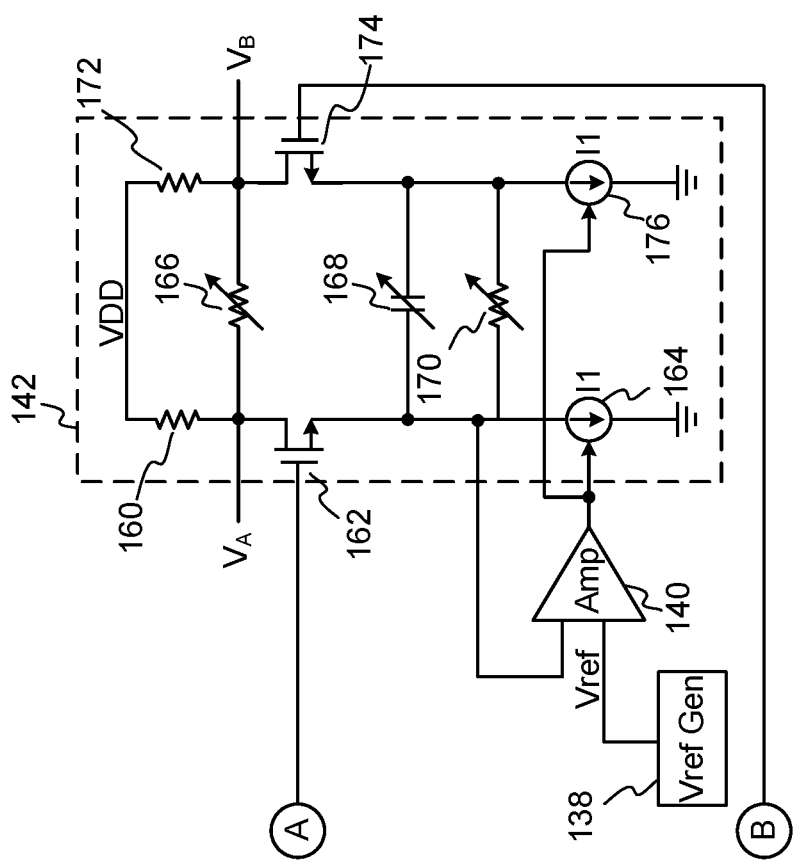

FIGS. 9a-9b illustrate a circuit diagram of a front-end of a receiver side of the present disclosure having a pi-coil. In an embodiment of a front-end of a receiver of the present disclosure, the front-end of the receiver comprises inputs pads 120a-120b, HBM EST 122a-122b, pi-coils (also referred to as "π-coil") 124a-124b, on-die termination resistors 126a-126b, blocking capacitors 128a-128b, resistors 130a-130b, CDM ESD 132a-132b, resistors 134a-134b, baseline wander correction circuit ("BLWC") 136, Vref generator 138, amplifier 140, and a linear equalizer ("LEQ") block 142. The pi-coils 124a-124b each comprise three serially connected inductors, $L_{in}$, $L_{mid}$, and $L_{out}$. Simulations can be applied to determine the relative values of each of the inductors for impedance matching of the corresponding capacitance to be hidden or contributed.

The LEQ block 142 further comprises resistors 160, 166, 170 and 172, transistors 162 and 174, capacitor 168, and current sources 164 and 176. The resistor 160, the transistor 162, and the current source 164 can be serially connected across the supply voltage VDD and ground, forming a first branch. The resistor 172, the transistor 174, and the current source 176 can also be serially connected across the supply voltage VDD and ground forming a second branch.

The resistor 166 can be a variable resistor that is coupled to the first branch at a serial connection between the resistor 160 and the transistor 162 and coupled to the second branch at a serial connection between the resistor 172 and the transistor 174. The capacitor 168 can be a variable capacitor and the resistor 170 is a variable resistor. The capacitor 168 and the resistor 170 are coupled in parallel with one end of the parallel connection coupled to the first branch at a serial connection between the transistor 162 and the current source 164 and with the other end of the parallel connection coupled to the second branch at a serial connection between the transistor 174 and the current source 176.

It can be appreciated that other implementations for the LEQ block 142 can be used in conjunction with the present disclosure. The LEQ block 142 is an example of one of those implementations to aid in the understanding of the invention. Other known LEQ blocks can be used in conjunction the present disclosure as well or none at all for certain transceiver systems. The present example is in no way meant to limit the present disclosure to such embodiments that use the LEQ block 142.

For processing the INP signal, the pad 120a, the pi-coil 124a, the blocking capacitor 128a, and the resistor 130a are serially connected. The pad 120a can receive the signal INP. The resistor 130a has a terminal coupled to the CDM ESD 132a, the resistor 134a, and a gate of the transistor 162 of the LEQ block 142. The HBM ESD 122a is coupled to a serial connection between the inductor $L_{in}$ and the inductor $L_{mid}$ of the pi-coil 124a. The resistor 126a is a variable resistor that is coupled to a serial connection between the inductor $L_{mid}$ and $L_{out}$ of the pi-coil 124a.

For processing the INN signal, the pad 120b, the pi-coil 124b, the blocking capacitor 128b, and the resistor 130b are serially connected. The pad 120b can receive the signal INN. The resistor 130b has a terminal coupled to the CDM ESD 132b, the resistor 134b, and a gate of the transistor 174 of the LEQ block 142. The HBM ESD 122b is coupled to a serial connection between the inductor $L_{in}$ and $L_{mid}$ of the pi-coil 124b. The resistor 126b is a variable resistor that is coupled to a serial connection between the inductor $L_{mid}$ and the inductor $L_{out}$ of the pi-coil 124b.

The BLWC 136 can have two inputs with one input coupled to a terminal of the resistor 134a and another input coupled to a terminal of the resistor 134b. The Vref generator 138 generates a reference voltage Vref that is coupled to one of the inputs of the amplifier 140. Another input of the amplifier 140 is coupled to a connection between the transistor 162 and the current source 164. The output of the amplifier 140 biases the current source 164 and 176 to generate a current I1 in the respective branches of the LEQ 142.

It can be appreciated that a pi-coil of the present disclosure can be used on the transmitter side as well for a transceiver system. To aid in the understanding of the present disclosure, a receiver is described herein in conjunction with a pi-coil. However, in no way is the present disclosure meant to be limited to receivers since it is apparent to a person having ordinary skill in the art that a pi-coil can be used in a transmitter as well.

Furthermore, it can be appreciated that the pi-coil can be used for differential signaling and single ended signaling as well. To aid in the understanding of the present disclosure, differential signaling is used herein in conjunction with a pi-coil. However, in no way is the present disclosure meant to be limited to differential signaling.

Operationally, the input terminals (i.e., pads 120a and 120b) receive a differential signal INP and INN from a transmitter TX (not shown) through a PCB channel (or other transmission medium). The differential signals INP and INN are then applied to the input terminal for the pi-coils 124a and 124b.

The HBM ESDs 122a-122b and CDM ESDs 132a and 132b can each be implemented by two serially connected diodes connected across the supply voltage VDD and ground. The HBM ESDs 122a-122b are disposed between the first inductor $L_{in}$ and the second inductor $L_{mid}$ of the pi-coils 124a and 124b, while the CDM ESDs 132a-132b (which typically have smaller capacitive values than the HBM ESDs 122a-122b) are disposed after the AC coupling capacitors 128a-128b (which can also be referred to as DC blocking capacitors). For a defined DC common-mode on the receiver side, DC voltage coming from the channel can be blocked using the AC coupling capacitors 128a-128b. It can be appreciated that the AC coupling capacitors 128a-128b can be optional circuit elements in a receiver, depending on the structure of the receiver.

On-die termination ("ODT") is represented by the resistors 126a and 126b, where each resistor has a variable resistance $R_{term}$. The resistors 126a and 126b are disposed between the middle inductor $L_{mid}$ and the third inductor $L_{out}$ of the respective pi-coil 124a-124b. The on-die AC coupling capacitors 128a-128b are used after the pi-coil 124a-124b network, which allows the input common-mode voltage of the linear equalizer circuit 142 to be set independently of the common-mode at the package pins (i.e., input terminals of the respective receiver). The CDM ESDs 132a-132b can be placed after the AC coupling capacitors 128a-128b while the resistors 130a-130b can be used for additional protection.

The common-mode voltage of the LEQ 142 can be determined by the BLWC 136. The resistance Rcm of the resistors 134a-134b can be used as a part of the BLWC 136. The LEQ 142 is used as a digitized calibration to adjust the AC gain through a frequency range by changing resistance values Rg for the resistor 166 and Rs for the resistor 170 and the capacitance value Cs for the capacitor 168. Moreover, to bias the current sources 164 and 176 of the LEQ 142, the operational amplifier 140 can be used to take a voltage feedback from the source of the transistor 162 and adjust the biasing voltage point of the current sources 164 and 176 by comparing the voltage feedback to the reference generator Vref. The LEQ 142, for example, can provide up to 10 dB boost at 12.5 GHz.

It can be appreciated that the LEQ 142 can have differential outputs $V_A$ and $V_B$ at the drain terminals of the transistors 162 and 174. The differential outputs $V_A$ and $V_B$ can be coupled to other components (not shown) of the receiver for processing the input signal. For instance, the differential outputs $V_A$ and $V_B$ can be connected to a voltage-gain amplifier ("VGA"), then from the VGA to a decision feedback equalizer ("DFE") and slicers. An output of the DFE can then be coupled to a serial-to-parallel converter ("S2P"). These additional components of the VGA, DFE, slicers, and S2P of the receiver are not shown, but are well known in the art.

Therefore, after receiving an input signal, a pi-coil can boost the input signal. Next, the DC common mode of the channel is eliminated by the DC blocking capacitors of the front end of the receiver. The BLWC can determine a DC common mode for the boosted input signal. The boosted signals can be inputted to the LEQ. The LEQ degrades low input frequency signals and boosts high input frequency signals since low input frequency signals are degraded less than high input frequency signals. The LEQ attempts to linearize the signals by changing the AC gain of received signals. The linearized signals can then be inputted to the remainder components of the receiver as discussed above, including the VGA, DFE and S2P.

FIG. 10 illustrates a graph of frequency versus gains when comparing a pi-coil circuit of the present disclosure used in a receiver with a t-coil circuit used in a receiver. One of the advantages of a pi-coil of the present disclosure over a t-coil is improvement in insertion loss. A t-coil network has a passive AC gain that is reduced by increasing the frequency data rate. A pi-coil network provides an AC gain and improves insertion loss and can also obtain a constant AC gain at the input of the LEQ circuit.

An AC gain for a t-coil network (shown in curve 200) and a pi-coil network (shown in curve 202) versus frequency is illustrated. The t-coil network can have an AC gain that is reduced by increasing frequency, but the pi-coil can provide an AC peaking gain in a certain frequency range, see area 204 for an example of such AC peaking gain. That AC peaking gain in the area 204 can be changed by adjusting inductance values for the inductors of the pi-coil in the receiver.

Moreover, when the frequency increases, an ESD capacitance can have a substantially constant value since it is implemented by a diode(s), but the ODT capacitance changes and decreases due to its metal properties. Therefore, a proper adjustment in inductance of the pi-coil can obtain a constant AC gain for the LEQ block. Additionally, the ESD capacitance can contribute and some parts of ESD capacitor can be placed in parallel with the ODT capacitor to improve input return loss.

Figure 11A:
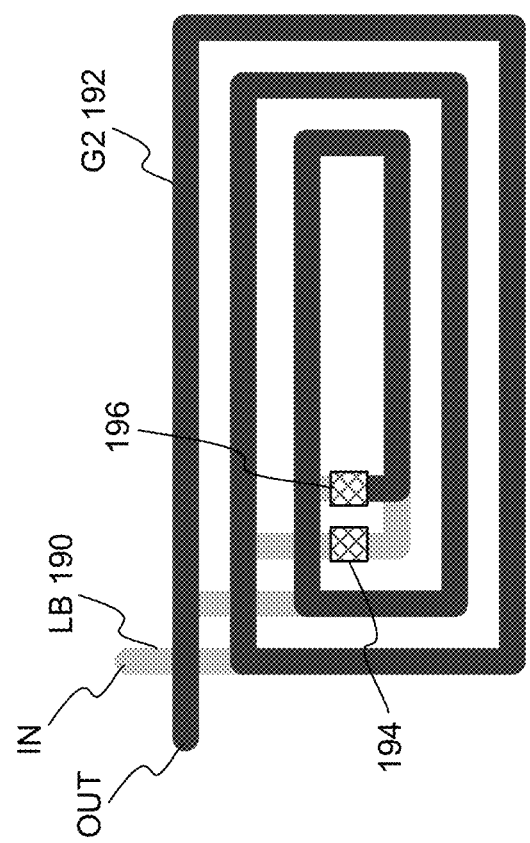

FIGS. 11*a*-11*c* illustrate a physical layout for a pi-coil of the present disclosure. A pi-coil can be physically implemented in various methods for implementing inductor circuit elements. In an embodiment of the present disclosure illustrated in FIG. 11*a*, a reliable and compact configuration for a physical layout of a pi-coil of the present disclosure is shown. A structure for the pi-coil comprises two layers of thick metal lines LB 190 and G2 192. The metal lines LB 190 and G2 192 are connected to each other by a via 196. The metal layers can be manufactured using a FINFET 14LPP technology or other circuit fabrication methods.

An input inductor $L_{in}$ of the pi-coil and a middle inductor $L_{mid}$ of the pi-coil can be implemented by the metal layer LB 190, while an output inductor $L_{out}$ is implemented by the second metal layer G2 192. The inductor $L_{in}$ is implemented by the metal layer LB 190, starting at the outer boundary and snaking inwards until a via 194. The inductor $L_{mid}$ is implemented by the metal layer LB 190, starting at the via 194 and snaking inwards until the via 196. The via 194 can be used to couple the pi-coil to one or more ESDs of the respective receiver. The via 196 can be used to couple the two layers LB 190 and G2 192 and can also be used to couple the ODT $R_{term}$ of the respective receiver.

Referring FIG. 11*b*, the single layer LB 190 is shown by itself to aid in the understanding of the present disclosure. The inductors $L_{in}$ and $L_{mid}$ are serially connected in the layer LB 190 with the inductor $L_{in}$ starting at the outer boundary and snaking inwards until the via 194 and the inductor $L_{mid}$ starting at the via 194 and snaking inwards until the via 196.

Referring FIG. 11*c*, the single layer G2 192 is shown by itself to aid in the understanding of the present disclosure. The inductor $L_{out}$ comprises the layer G2 192 and is coupled to the ODT of the respective receiver and to the layer LB 190 via the via 196.

Such layout can have a compact size that may be only 3.2 mm². The value of an output inductance can be larger than input and middle inductances to shield effects of the capacitive loads on the LEQ. Such pi-coil sizing can achieve an input return loss lower than −8 dB and up to 15 GHz, while insertion loss can have a lowest value of −0.4 dB and an AC peaking gain has a peak of 2 dB.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A high-speed serial link receiver system, comprising:
   an input terminal for receiving a signal;
   a pi-coil including a first inductor, a second inductor, and a third inductor;
   a first electrostatic discharge device ("ESD");
   a second ESD;
   an on-die-termination ("ODT"); and
   a receiver,
   wherein the first inductor, the second inductor, and the third inductor are serially connected,
   wherein the input terminal is coupled to the first inductor,
   wherein a serial connection between the first inductor and the second inductor is coupled to the first ESD device,
   wherein a serial connection between the second inductor and the third inductor is coupled to the ODT, and
   wherein the second ESD device and the receiver are coupled to the third inductor.

2. The high-speed serial link receiver system of claim 1 wherein the first ESD is a capacitor, the second ESD is a capacitor, and the ODT is a variable resistor.

3. The high-speed serial link receiver system of claim 1 wherein an inductance value for the first inductor is substantially equal to an inductance value for the third inductor and wherein the inductance value for each of the first inductor and the third inductor is greater than an inductance value for the second inductor.

4. The high-speed serial link receiver system of claim 1 wherein the pi-coil is implemented by a first metal layer and a second metal layer, wherein the first metal layer and the second metal layer are parallel, wherein inductance for the first inductor and the second inductor are provided by the first metal layer, and wherein inductance for the third inductor is provided by the second metal layer.

5. The high-speed serial link receiver system of claim 1 further comprising a capacitor for ESD protection, wherein the capacitor is connected in parallel with the ODT.

6. The high-speed serial link receiver system of claim 1 further comprising a capacitor for AC coupling and a resistor, wherein the third inductor and the second ESD are coupled via the capacitor and the resistor.

7. The high-speed serial link receiver system of claim 1 wherein the first ESD comprises two serially-connected diodes, and wherein the second ESD comprises two serially-connected diodes.

8. The high-speed serial link receiver system of claim 1 further comprising a baseline wander correction circuit ("BLWC"), reference voltage generator, an amplifier and a linear equalizer ("LEQ").

9. The high-speed serial link receiver system of claim 8 wherein the BLWC is coupled to the second EDD and the LEQ via a resistor, wherein the amplifier is coupled to the LEQ for biasing a current source of the LEQ, wherein a first input of the amplifier is feedback from the LEQ, and wherein a second input of the amplifier is coupled to the reference voltage generator for receiving a reference voltage to compare with the feedback.

10. A method for processing a differential signal by a front end of a high-speed serial link receiver system, comprising the steps of:
   receiving a differential signal;
   contributing capacitive loads of the system by a pi-coil, wherein the capacitive loads are generated by electrostatic discharge devices ("ESDs") and a capacitive load from an on-die-termination resistance;

determining a common mode voltage for a linear equalizer ("LEQ") of the system by a baseline wander correction circuit ("BLWC"); and equalizing the received differential signal based on the determined common mode voltage.

11. A high-speed serial link receiver system, comprising:
input terminals for receiving a differential signal;
a first pi-coil and a second pi-coil, wherein each of the pi-coils comprises a first inductor, a second inductor, and a third inductor;
a first set of electrostatic discharge devices ("ESDs") for human body model ("HBM") protection;
a second set of electrostatic discharge devices for charge device model ("CDM") protection;
a first on-die-termination ("ODT") and a second ODT each corresponding to the respective first pi-coil and the respective second pi-coil; and
receivers,
wherein the first inductor, the second inductor, and the third inductor for each one of the pi-coils are serially connected,
wherein the input terminals are coupled to the first inductors of the pi-coils,
wherein a serial connection between the first inductor and the second inductor of each of the pi-coils is coupled to the first set of the ESDs,
wherein a serial connection between the second inductor and the third inductor of each of the pi-coils is coupled to the respective corresponding ODT, and
wherein one of the second set of ESDs and one of the receivers are coupled to one of the third inductors of the pi-coils.

12. The high-speed serial link receiver system of claim 11 wherein the first set of ESDs are implemented by capacitors, the second set of ESDs are implemented by capacitors, and the ODTs are implemented by variable resistors.

13. The high-speed serial link receiver system of claim 11 wherein, for each one of the pi-coils, an inductance value for the first inductor is substantially equal to an inductance value for the third inductor and wherein the inductance value for each of the first inductor and the third inductor is greater than an inductance value for the second inductor.

14. The high-speed serial link receiver system of claim 11 further comprising a first and a second capacitor for ESD protection, wherein the first and the second capacitors are each connected in parallel with the first ODT and the second ODT, respectively.

15. The high-speed serial link receiver system of claim 11 further comprising a first coupling capacitor, a second coupling capacitor, a first protection resistor, and a second protection resistor, wherein the third inductor of one of the pi-coils and one of the second set of ESDs are coupled via the first capacitor and the first resistor, and wherein the third inductor of another one of the pi-coils and another one of the second set of ESDs are coupled via the second capacitor and the second resistor.

16. The high-speed serial link receiver system of claim 11 wherein each one of the first set of ESDs comprises two serially-connected diodes, and wherein each one of the second set of ESDs comprises two serially-connected diodes.

17. The high-speed serial link receiver system of claim 11 further comprising a baseline wander correction circuit ("BLWC"), reference voltage generator, an amplifier and a linear equalizer ("LEQ").

18. The high-speed serial link receiver system of claim 17 wherein the BLWC is coupled to the second set of the ESDs and the LEQ via resistors, wherein the amplifier is coupled to the LEQ for biasing current sources of the LEQ, wherein a first input of the amplifier is feedback from the LEQ, and wherein a second input of the amplifier is coupled to the reference voltage generator for receiving a reference voltage to compare with the feedback.

19. The high-speed serial link receiver system of claim 17, wherein the LEQ comprises a first resistor, a second resistor, a first transistor, a second transistor, a first current source, a second current source, a first variable resistor, a variable capacitor, and a second variable resistor.

20. The high-speed serial link receiver system of claim 19 wherein the first resistor, the first transistor, and the first current source are serially connected in a first branch, the second resistor, the second transistor, the second current source serially connected in a second branch, wherein the first variable resistor is coupled to the first branch at a first terminal of the first transistor and to the second branch at a first terminal of the second transistor, wherein the variable capacitor and the second variable resistor are connected in parallel with one end of the parallel connection coupled to the first branch at a second terminal of the first transistor and another end of the parallel connection coupled to the second branch at a second terminal of the second transistor, wherein an output of the amplifier is coupled to the first current source and the second current source for biasing of the first current source and the second current source, and wherein an input of the amplifier is coupled to the second terminal of the first transistor.

* * * * *